(12) United States Patent
Kim

(10) Patent No.: US 7,612,351 B2
(45) Date of Patent: Nov. 3, 2009

(54) ION IMPLANTER WITH FUNCTION OF COMPENSATING WAFER CUT ANGLE AND ION IMPLANTATION METHOD USING THE SAME

(75) Inventor: Hag Dong Kim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 179 days.

(21) Appl. No.: 11/925,397

(22) Filed: Oct. 26, 2007

(65) Prior Publication Data

US 2008/0105834 A1    May 8, 2008

(30) Foreign Application Priority Data

Nov. 3, 2006    (KR) .................... 10-2006-0108377

(51) Int. Cl.
*H01J 37/317* (2006.01)
*H01J 37/244* (2006.01)
*G21K 5/10* (2006.01)

(52) U.S. Cl. .................. 250/492.21; 250/492.2; 250/492.3; 250/440.11; 250/442.11; 250/398; 250/397

(58) Field of Classification Search ............ 250/492.21, 250/492.2, 492.3, 440.11, 442.11, 398, 397
See application file for complete search history.

(56) References Cited

U.S. PATENT DOCUMENTS 6,163,033 A * 12/2000 Smick et al. ........... 250/441.11
7,397,046 B2 * 7/2008 Yue et al. ............... 250/492.21

FOREIGN PATENT DOCUMENTS

KR   10-2006-0075924   7/2006

* cited by examiner

*Primary Examiner*—Nikita Wells
(74) *Attorney, Agent, or Firm*—Workman Nydegger

(57) ABSTRACT

Provided are an ion implanter for compensating for a wafer cut angle and an ion implantation method using the same. The ion implanter may include an orienter for rotating a wafer mounted on an alignment stage thereof to align a notch of the wafer and a wafer stage for mounting thereon the wafer whose notch has been aligned. The ion implanter may further include an ion implantation angle adjustment unit for adjusting an angle of the wafer stage, a cut angle measurement unit for measuring the wafer cut angle while the wafer is mounted and rotated on the alignment stage, and a controller for controlling the ion implantation angle adjustment unit to compensate for the measured wafer cut angle.

9 Claims, 3 Drawing Sheets

ION IMPLANTER WITH FUNCTION OF COMPENSATING WAFER CUT ANGLE AND ION IMPLANTATION METHOD USING THE SAME

CROSS-REFERENCE TO RELATED APPLICATION

This application claims priority to Korean Application No. 10-2006-0108377, filed on Nov. 3, 2006, which is incorporated herein by reference in its entirety.

BACKGROUND

1. Field of the Invention

The present invention relates to an ion implanter for compensating for a wafer cut angle and an ion implantation method using the same. More particularly, the present invention relates to an ion implanter for compensating for a wafer cut angle generated during wafer fabrication, when adjusting an angle of ion implantation into the wafer, and an ion implantation method using the same.

2. Background of the Invention

In general, a semiconductor device may be fabricated through a variety of unit processes, for example, an exposure process, a diffusion process, an etching process, a chemical vapor deposition process, and an ion implantation process.

Among the unit processes for fabricating the semiconductor device, the ion implantation process is a process of infiltrating impurities of a plasma ion-beam state into a surface of an intrinsic silicon (Si) wafer and acquiring a required conductive resistivity device.

A conventional ion implantation device will be described below with reference to the accompanying drawings.

FIG. 1 illustrates a configuration view of a conventional ion implanter. As shown in FIG. 1, the conventional ion implanter 10 includes an orienter 11 for aligning a notch of a wafer W; a wafer stage 12 for mounting thereon the wafer W for ion implantation after completion of notch alignment; an ion implantation angle adjustment unit 13 for adjusting a slope of the wafer stage 12 to adjust an ion implantation angle of the wafer W mounted on the wafer stage 12; an ion beam generator 14 for irradiating an ion beam toward the wafer W mounted on the wafer stage 12; a scan driver 15 for moving the wafer stage 12 and allowing the ion beam irradiated by the ion beam generator 14 to scan the wafer W; and a controller 16 for controlling the orienter 11, the ion implantation angle adjustment unit 13, and the scan driver 15.

In the conventional ion implanter, when the orienter 11 completes the notch alignment, the wafer W is loaded on the wafer stage 12 and is subjected to an ion implantation process by the ion beam generated from the ion beam generator 14. Before an ion beam is irradiated into the wafer W, a slope of the wafer stage 12 is controlled using the ion implantation angle adjustment unit 13, thereby adjusting an angle at which the ion beam is injected into the wafer W.

However, the conventional ion implanter 10 measures and corrects a zero angle by hardware at the time of ion implantation into the wafer W and then keeps performing ion implantation on the basis of the corrected zero angle. Thus, a correction to compensate for a wafer cut angle, that is, an angle generated at the time of cutting a wafer, is not made. Therefore, there is a drawback in that an ion implantation angle cannot be delicately controlled even when a semiconductor device's after-ion-implantation profile is significantly varied, according to the ion implantation angle, due to miniaturization of the semiconductor device.

SUMMARY OF SOME EXAMPLE EMBODIMENTS

In general, example embodiments of the invention relate to an ion implanter for compensating for a wafer cut angle generated during wafer fabrication, when adjusting an angle of ion implantation into the wafer, and an ion implantation method using the same. Accordingly, an ion implantation angle may exactly correspond with a desired angle that takes the wafer cut angle into consideration, thus enabling a delicate ion implantation process.

In accordance with one example embodiment, there is provided an ion implanter for compensating for a wafer cut angle. The ion implanter may include an orienter for rotating a wafer mounted on an alignment stage thereof to align a notch of the wafer and a wafer stage for mounting thereon the wafer whose notch has been aligned. In addition, the ion implanter may include an ion implantation angle adjustment unit for adjusting an angle of the wafer stage, a cut angle measurement unit for measuring the wafer cut angle while the wafer is mounted and rotated on the alignment stage, and a controller for controlling the ion implantation angle adjustment unit to compensate for the measured wafer cut angle.

In accordance with another example embodiment, there is provided an ion implantation method for compensating for a wafer cut angle. The method may include aligning a notch of a wafer. Next, the wafer cut angle may be calculated and an ion implantation angle of the wafer may be adjusted in consideration of the calculated wafer cut angle. Finally, the method may also include injecting an ion beam to implant ions into the wafer.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Hereinafter, aspects of example embodiments of the present invention will be described in detail with reference to the accompanying drawings so that they can be readily implemented by those skilled in the art.

Figure 1:
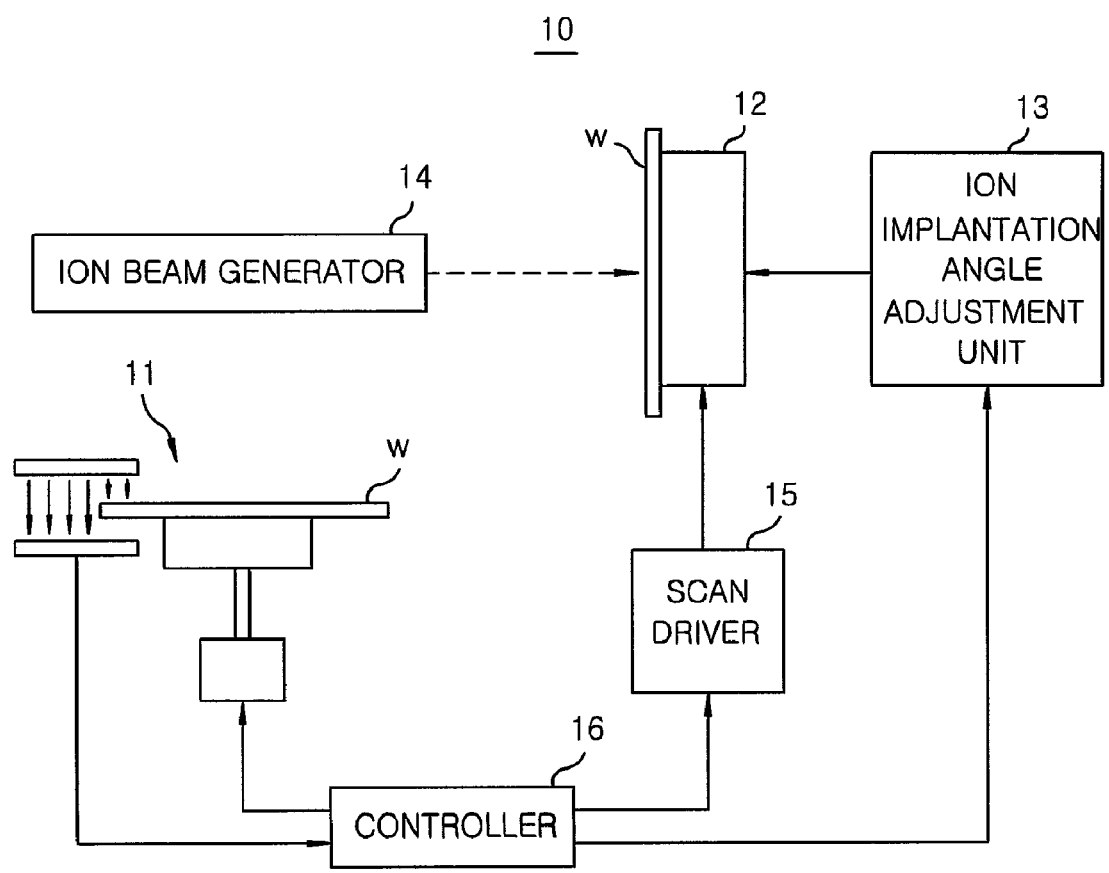
FIG. 1 illustrates a configuration view of a conventional ion implanter.
Figure 2:
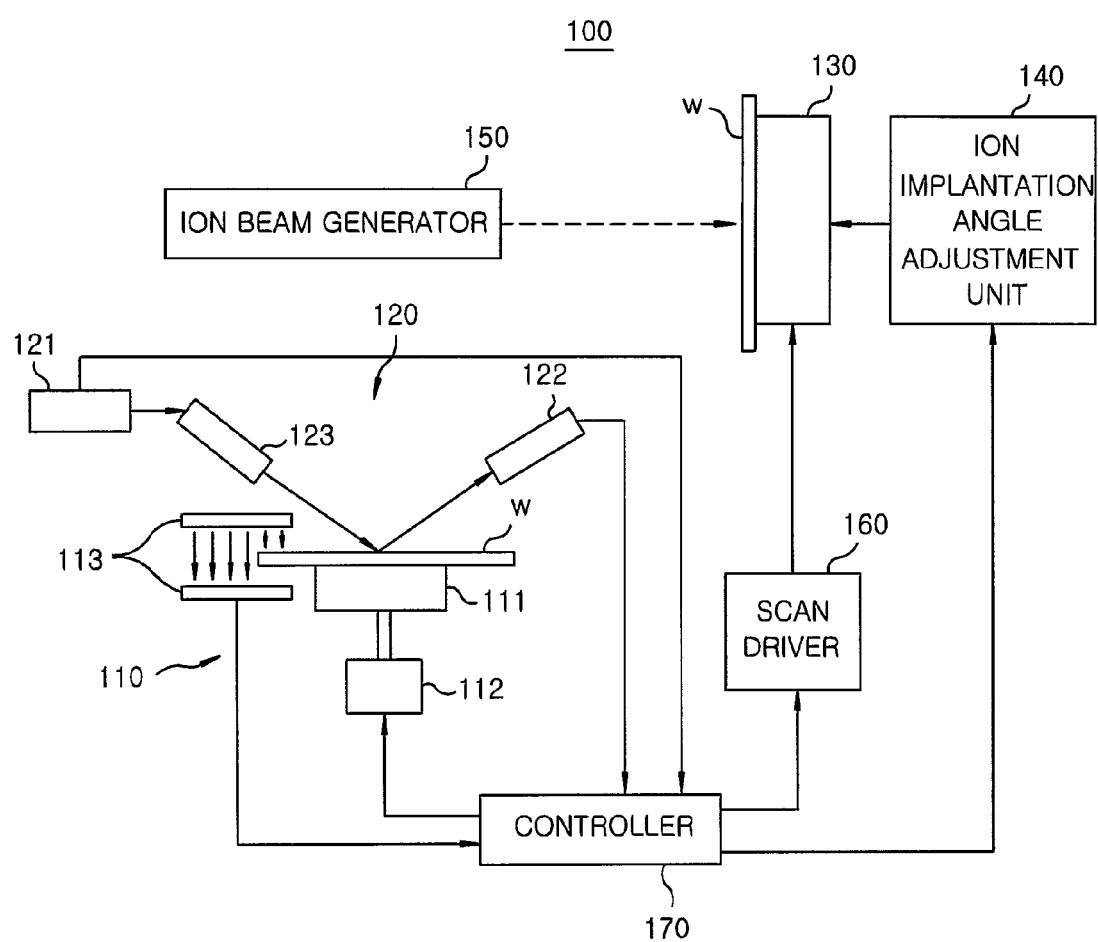
FIG. 2 illustrates a configuration view of an ion implanter for compensating for a wafer cut angle in accordance with the present invention.

FIG. 2 illustrates a configuration view of an ion implanter for compensating for a wafer cut angle. As shown in FIG. 2, the ion implanter 100 for compensating for the wafer cut angle may include an orienter 110, a cut angle measurement unit 120, a wafer stage 130, an ion implantation angle adjustment unit 140, an ion beam generator 150, a scan driver 160, and a controller 170. The orienter 110 may align a notch of a wafer W. The cut angle measurement unit 120 may measure a cut angle of the wafer W positioned at the orienter 110. The wafer stage 130 may mount the wafer W for an ion implantation process after completing notch alignment and cut angle measurement. The ion implantation angle adjustment unit 140 may adjust an angle of the wafer stage 130 thereby adjusting an angle at which an ion beam is injected into the wafer W. The ion beam generator 150 may generate and inject the ion beam into the wafer W. The scan driver 160 may move the wafer stage 130 to allow an ion beam generated by the ion beam generator 10 to scan the wafer W. The controller 170 may control the ion implantation angle adjustment unit 140 to compensate for the wafer cut angle measured by the cut angle measurement unit 120.

The orienter 110 may include an alignment stage 111, a rotation motor 112, and a notch sensor 113. The alignment stage 111 may mount the wafer W on its top surface. The rotation motor 112 may rotate the alignment stage 111. The notch sensor 113 may be installed at one side of the alignment stage 111 and may sense the notch of the wafer W.

The notch sensor 113 may include a light emitting element and a light receiving element. The light emitting element may emit a beam having a specific wavelength toward an edge of the wafer W. The light receiving element may sense a notch by using the beam received from the light emitting element and may output a detection signal to the controller 170.

The cut angle measurement unit 120 may be installed at an upper side of the alignment stage 111 of the orienter 110 and may measure a cut angle generated by cutting when the wafer W is fabricated. To this end, the cut angle measurement unit 120 may include a beam generator 121 and a detector 122. The beam generator 121 may generate and irradiate a beam, for example, X-rays, into the wafer W. The detector 122 may receive a beam that is irradiated from the beam generator 121 and reflected from the rotating wafer W and may output a detection signal to the controller 170. The cut angle measurement unit 120 may further include a beam path adjustment unit 123 for adjusting a path of a beam such that a beam generated by the beam generator 121 is inclinedly incident on the wafer W, i.e., such that the beam's angle of incidence is non-perpendicular with respect to the wafer surface.

The wafer stage 130 may load and mount thereon, by a wafer transfer robot, the wafer W for an ion implantation process after completion of notch alignment.

The ion implantation angle adjustment unit 140 may adjust a slope of the wafer stage 130 by a driving unit such as a motor or a cylinder, etc., thereby adjusting an ion implantation angle with respect to the wafer W.

The ion beam generator 150 may generate and inject an ion beam into the wafer W along a specific path for ion implantation into the wafer W. The scan driver 160 may move the wafer stage 130 in all directions by a driving unit, such as a rotation motor or a linear motor, to allow the ion beam to scan the wafer W.

The controller 170 may control the orienter 110, the cut angle measurement unit 120, the ion implantation angle adjustment unit 140, the ion beam generator 150, and the scan driver 160. The controller may 170 control the ion implantation angle adjustment unit 140 to take into consideration the wafer cut angle measured by the cut angle measurement unit 120 such that injection of an ion beam into the wafer W can be accurately performed at a desired angle.

The controller 170 can calculate a cut angle of a wafer W in various ways. For example, the controller 170 can calculate a wafer cut angle based on a variation of an intensity amount and/or a wavelength of the beam received by the detector 122. The variation may be caused by rotation of the wafer W and may be detected by the detector 122. In other words, a variation of an intensity amount and/or a wavelength of a reflected beam may occur because of rotation of a silicon lattice caused by the rotation of the wafer W. The variation may be acquired or derived from the detection signal generated by the detector 122 that receives a beam outputted from the beam generator 121 and reflected from the rotating wafer W. From this variation, the controller 170 may calculate a cut angle generated by cutting during fabrication of the wafer W. To accomplish this, the controller 170 may reference data retained therein or in a separate memory module. The data may include, e.g., a lookup table of numerical values for wafer cut angles corresponding to different variations of an intensity amount and/or a wavelength of a beam that the detector 122 receives.

A detailed description of operation of the ion implanter 100 for compensating for the cut angle of the wafer will now be made in connection with a description of an exemplary ion implantation method for compensating for a wafer cut angle.

Figure 3:
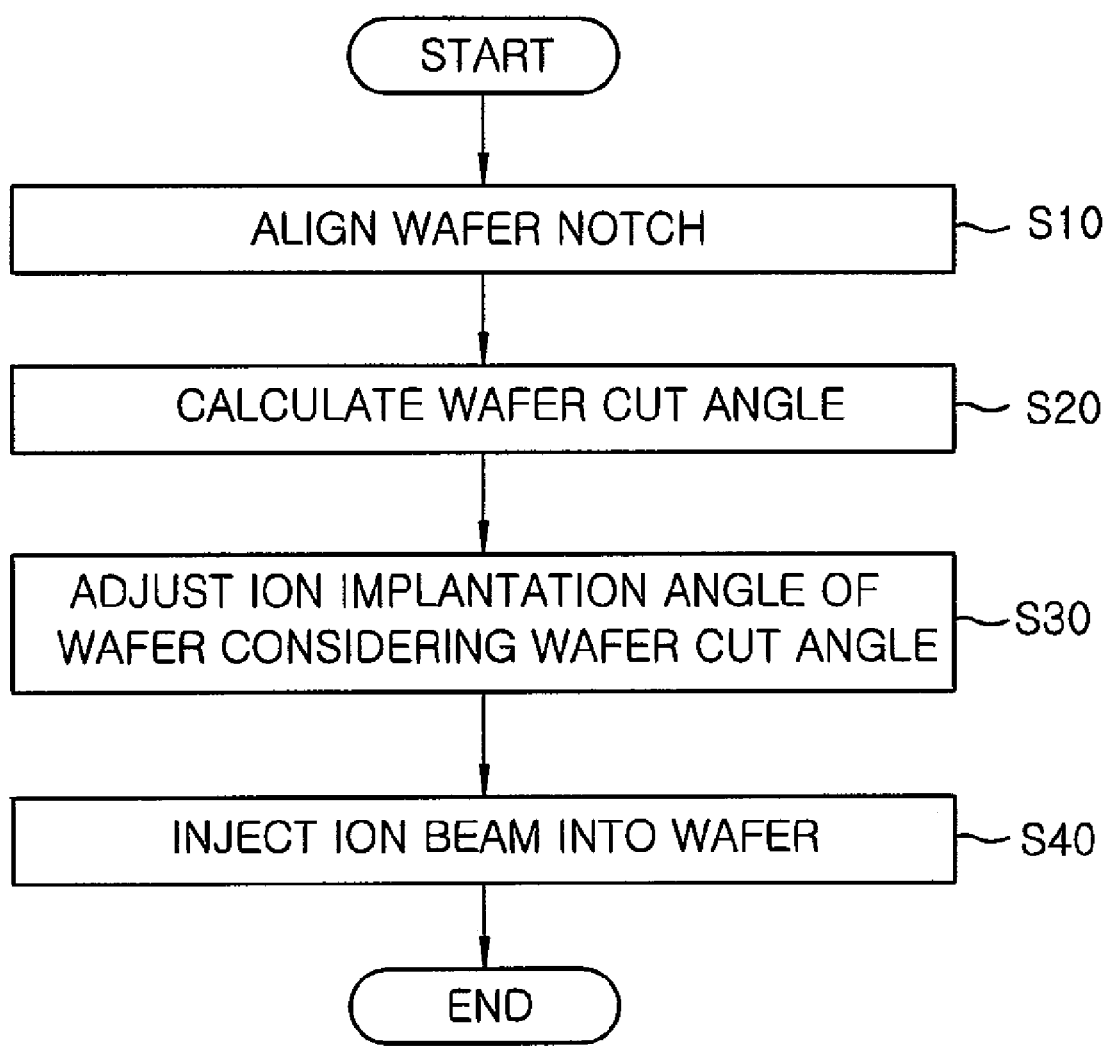
FIG. 3 illustrates a flowchart of an ion implantation method for compensating for a wafer cut angle in accordance with the present invention.

FIG. 3 illustrates a flowchart of an exemplary ion implantation method for compensating for a wafer cut angle.

The ion implantation method may include aligning a wafer notch (step S10), calculating a cut angle of a wafer (step S20), adjusting an ion implantation angle of the wafer in consideration of the wafer cut angle (step S30), and injecting an ion beam into the wafer (step S40).

In the step S10 of aligning the wafer notch, the notch sensor 113 may sense a notch of a wafer W loaded on the alignment stage 111 of the orienter 110 and the rotation motor 112 may rotate the wafer W, thereby aligning the notch.

In the step S20 of calculating the cut angle of the wafer, the detector 122 may receive a reflection of a beam, e.g., X-rays, generated by the beam generator 121 and inclinedly incident on the wafer W mounted on the alignment stage 111 of the orienter 110. The detector 122 may output a detection signal indicating a variation of an intensity amount and/or a wavelength of the received beam to the controller 170. Using the detection signal of the detector 122, the controller 170 may calculate a wafer cut angle based on the intensity amount and/or wavelength variation. The variation of beam intensity amount and/or wavelength is caused by a collision and reflection of the beam from a silicon lattice of the rotating wafer W. The controller 170 may use previously stored data representing a relationship between a wafer cut angle and a variation of the beam to calculate the wafer cut angle.

After calculating the cut angle of the wafer W, the controller 170 may control an angle of the wafer W, i.e., an angle of ion implantation into the wafer W, in consideration of the cut angle of the wafer W in the step S30. For example, the controller 170 may compensate for the cut angle of the wafer W by controlling the ion implantation angle adjustment unit 140 to exactly coincide an angle of an ion beam incident on the wafer W with a desired ion implantation angle. Accordingly, the angle of the ion beam incident on the wafer W may be controlled with consideration of an actual wafer angle generated due to the cut angle of the wafer W. By doing so, an angle at which an ion beam generated by the ion beam generator 150 is incident on the wafer W may be equal to a desired angle that takes into consideration the wafer cut angle and thus, a delicate ion implantation process can be performed.

As described above, in an ion implanter for compensating for a wafer cut angle and an ion implantation method using the same, the wafer cut angle generated by cutting when a wafer is fabricated may be measured and compensated for when adjusting an angle of ion implantation into the wafer. Thus, an ion implantation angle may exactly correspond with a desired angle that takes into consideration the wafer cut angle, thus enabling a delicate ion implantation process.

While the invention has been shown and described with respect to the embodiments, it will be understood by those skilled in the art that various changes and modifications may be made without departing from the scope of the invention as defined in the following claims.

What is claimed is:

1. An ion implanter for compensating for a wafer cut angle, the ion implanter comprising:
   an orienter adapted to rotate a wafer mounted on an alignment stage thereof to align a notch of the wafer;
   a wafer stage adapted to have the wafer whose notch has been aligned mounted thereon;
   an ion implantation angle adjustment unit adapted to adjust an angle of the wafer stage;
   a cut angle measurement unit adapted to measure the wafer cut angle while the wafer is mounted and rotated on the alignment stage; and
   a controller adapted to calculate the wafer cut angle and to control the ion implantation angle adjustment unit to compensate for the calculated wafer cut angle.

2. The implanter of claim 1, wherein the cut angle measurement unit includes:
   a beam generator adapted to generate and irradiate a beam into the wafer; and
   a detector adapted to receive the beam that is irradiated from the beam generator and reflected from the rotating wafer and to generate a detection signal.

3. The implanter of claim 2, wherein the cut angle measurement unit further includes a beam path adjustment unit adapted to adjust a path of the beam irradiated into the wafer to make the beam inclinedly incident on the wafer.

4. The implanter of claim 2, wherein the controller is adapted to derive, based on the detection signal, a variation of an intensity amount and/or a wavelength of the beam that is caused by rotation of the wafer and to calculate the wafer cut angle based on the variation of the intensity amount and/or the wavelength of the beam.

5. The implanter of claim 4, wherein the controller is adapted to calculate the wafer cut angle using pre-stored data representing a relationship between the wafer cut angle and the variation of the intensity amount and/or the wavelength of the beam.

6. An ion implantation method for compensating for a wafer cut angle, the method comprising:
   mounting a wafer on a support element;
   manipulating the support element so as to align a notch of the wafer;
   calculating the wafer cut angle;
   adjusting an ion implantation angle of the wafer in consideration of the calculated wafer cut angle; and
   injecting an ion beam to implant ions into the wafer.

7. The method of claim 6, wherein the step of calculating the wafer cut angle includes:
   irradiating a beam into the wafer and receiving the beam that is reflected from the rotating wafer;
   generating a detection signal based on the received beam;
   deriving, based on the detection signal, a variation of an intensity amount and/or a wavelength of the beam that is caused by rotation of the wafer; and
   calculating the wafer cut angle based on the variation of the intensity amount and/or the wavelength of the beam.

8. The method of claim 7, wherein a path of the beam irradiated into the wafer is adjusted to make the beam inclinedly incident on the wafer.

9. The method of claim 7, wherein the wafer cut angle is calculated using pre-stored data representing a relationship between the wafer cut angle and the variation of the intensity amount and/or the wavelength of the beam.

* * * * *